United States Patent
Ideler

[11] Patent Number: 6,031,422
[45] Date of Patent: Feb. 29, 2000

[54] POWER AMPLIFIER AND NUCLEAR MAGNETIC RESONANCE TOMOGRAPHY APPARATUS EMPLOYING SAME

[75] Inventor: Karl-Heinz Ideler, Spardorf, Germany

[73] Assignee: Sony Corporation, Tokyo, Japan

[21] Appl. No.: 09/128,546

[22] Filed: Aug. 4, 1998

[30] Foreign Application Priority Data

Aug. 6, 1997 [DE] Germany .................. 197 34 045

[51] Int. Cl.⁷ .................................................. H03F 3/38
[52] U.S. Cl. ................................... 330/10; 324/322
[58] Field of Search ............... 330/10; 363/98; 324/322

[56] References Cited

U.S. PATENT DOCUMENTS

| | | | |
|---|---|---|---|
| 4,742,311 | 5/1988 | Van der Zwart | 330/297 |
| 4,788,452 | 11/1988 | Stanley | 307/71 |
| 5,063,349 | 11/1991 | Roemer et al. | 324/322 |
| 5,146,400 | 9/1992 | Von Der Broeck | 363/98 |
| 5,245,287 | 9/1993 | Nowak et al. | 324/322 |
| 5,270,657 | 12/1993 | Wirth et al. | 324/322 |
| 5,451,878 | 9/1995 | Wirth et al. | 324/322 |
| 5,513,094 | 4/1996 | Stanley | 363/98 |
| 5,515,002 | 5/1996 | Ideler | 330/251 |

FOREIGN PATENT DOCUMENTS 196 10 083  9/1996  Germany .

*Primary Examiner*—Robert Pascal
*Assistant Examiner*—Khanh Van Nguyen
*Attorney, Agent, or Firm*—Hill & Simpson

[57] ABSTRACT

A power amplifier has a supply assembly for offering an intermediate circuit voltage and an output stage connected to the supply assembly for generating an output voltage from the intermediate circuit voltage. The supply assembly contains at least two voltage sources that can be optionally connected in parallel or in series via at least one switch stage. A nuclear magnetic resonance tomography apparatus can be equipped with such a power amplifier. The power amplifier exhibits the required high performance capability in quantitative and qualitative terms, with low losses.

6 Claims, 2 Drawing Sheets

POWER AMPLIFIER AND NUCLEAR MAGNETIC RESONANCE TOMOGRAPHY APPARATUS EMPLOYING SAME

BACKGROUND OF THE INVENTION

1. Field of the Invention

The invention is directed to a power amplifier and to a nuclear magnetic resonance tomography apparatus employing same. The power amplifier can be utilized in all fields wherein high output voltages and currents must be offered, particularly for inductive loads. For example, the amplifier is suitable for driving motors and actuators in automation technology, traffic technology and systems technology. In particular, however, the amplifier is suitable for use in medical technology as a gradient amplifier in nuclear magnetic resonance tomography (magnetic resonance imaging).

2. Description of the Prior Art

A nuclear magnetic resonance tomography apparatus typically has an orthogonal gradient coil system that surrounds the patient volume. A gradient amplifier which supplies the coil with an exactly regulated current is provided for each gradient coil. For example, the current through each gradient coil can reach values up to 300 A in a predetermined current curve that must be adhered to with a precision in the mA range. In order to achieve the steep current edges that are also required, voltages of, for example, over 1000 V must, for example, be applied to the gradient coil. The precision and dynamics of the gradient current are critical for the image quality. Moreover, the gradient amplifier must offer adequate power in order to accommodate the ohmic losses given a constant current flow of, for example, 300 A through the gradient coil, even in the case of longer current pulses.

U.S. Pat. No. 5,515,002 discloses a gradient amplifier having a supply assembly for offering a intermediate circuit voltage and an output stage connected to the supply assembly for generating an output voltage from the intermediate circuit voltage. The output stage is fashioned as a switched output stage employing bridge circuitry, with MOSFET transistors being utilized as switch elements.

The intermediate circuit voltage in this known gradient amplifier must be correspondingly high because of the high output voltages to be achieved for fast current variations. Further, a high switching frequency is required in order to achieve the required current regulating precision given slight residual ripple. For these reasons, high switching losses occur at the MOSFET transistors of the output stage.

SUMMARY OF THE INVENTION

An object of the present invention, is to provide a power amplifier which avoids the aforementioned problems and which exhibits the required performance capability in quantitative and qualitative terms, with low losses.

The above object is achieved in accordance with the principles of the present invention in a power amplifier, particularly a gradient amplifier for use in a nuclear magnetic resonance tomography apparatus, having a supply assembly which produces an intermediate circuit voltage, an output stage connected to the supply assembly which generates an output voltage from the intermediate circuit voltage, and wherein the supply assembly contains at least two voltage sources which can be selectively connected in parallel or in series via at least one switch stage.

Because at least two voltage sources of the supply assembly are optionally switchable parallel or in series, the intermediate circuit voltage can be matched to the output voltage of the amplifier which is to be achieved. Given high current rise rates, there is the possibility of temporarily offering a correspondingly high intermediate circuit voltage by a series connection of the voltage sources. When, by contrast, a lower output voltage is required (possibly given a high current intensity), the voltage sources can be connected in parallel. A higher on/off ratio (duty cycle) of the switch elements of the output stage is possible as a result of the lower intermediate circuit voltage achieved in this way, so that significantly lower switching losses occur. Moreover, the required power is uniformly divided among the voltage sources, so that high continuous powers are possible. Overall, the inventive gradient amplifier thus exhibits considerable advantages with respect to dissipated power, cooling requirements, structural size and costs.

In a preferred embodiment, the supply assembly of the power amplifier is formed of a number of branches connected in parallel. In each branch one of the voltage sources is connected in series with at least one diode. Each switch is preferably connected to opposite poles of two voltage sources. The voltage sources are preferably connected in series when the switch is conductive (in the momentary direction of the current) but are otherwise connected in parallel.

The supply assembly preferably includes two, three or more voltage sources that are driven in common in a preferred embodiment and are thus always either all connected in series or all connected in parallel. in alternative embodiments series and parallel circuitry can be used in combination so as to offer intermediate values of the intermediate circuit voltage. Given, for example, four voltage sources, two of these can be connected in parallel and these pairs can in turn be connected in series.

In the feedback mode of the power amplifier, the magnetic energy stored in the inductive load can be returned to the power amplifier via unbiased diodes. The voltage sources are preferably connected in series for faster current dismantling. This can ensue by including one diode in each switch arrangement. Alternatively or additionally, each switch arrangement can be actively driven in a feedback mode in order to connect the voltage sources in series. The combination of these two possibilities has the advantage that transition problems are avoided given a reversal of the current direction due to an activation of the switch arrangement at the zero-axis crossing. In preferred embodiments, the recognition of the onset of the feedback mode ensues with an evaluation of the current curve or by direct measurement at the switch devices.

In the normal mode of the power amplifier, the voltage sources are preferably connected in series when the output voltage to be achieved exceeds a predetermined threshold, and thus a high intermediate circuit voltage is required. Other switching strategies are also possible, particularly those wherein a future current requirement or a charge condition of the individual voltage sources is taken into consideration.

The output stage preferably includes a switch bridge and generates the output voltage with pulse-width modulation.

DESCRIPTION OF THE PREFERRED EMBODIMENTS

Figure 1:
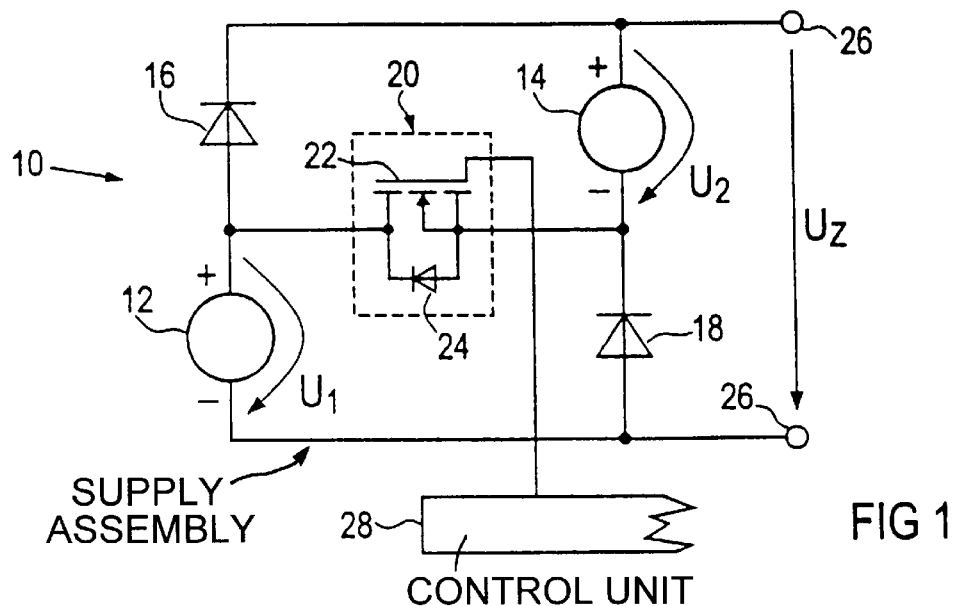
FIG. 1 is a block circuit diagram of a supply assembly in the inventive power amplifier.

The supply assembly 10 shown in FIG. 1 includes a first voltage source 12 for offering a first supply voltage $U_1$, a second voltage source 14 for offering a second supply voltage $U_2$, a first diode 16, a second diode 18 and a switch stage 20. In the exemplary embodiment described here, the voltages $U_1$ and $U_2$ are equal.

A first branch of the supply assembly 10 is formed by the first voltage source 12 and the first diode 16, whose anode is connected to the positive pole of the first voltage source 12. Together, the second voltage source 14 and the second diode 18, which has its cathode connected to the negative pole of the second voltage source 14, form a second branch of the supply assembly 10. The two branches are connected in parallel and are connected to two intermediate circuit terminals 26. An intermediate circuit voltage $U_z$ generated by the supply assembly 10 is across terminals 26.

The switch stage 20 is formed of a MOSFET transistor 22 with an inherent diode 24 and is connected between the two branches, to the positive pole of the first voltage source 12 and the negative pole of the second voltage source 14. MOSFET modules suitable for the switch stage 20 are available, for example, under the model designation "Siemens BSM". The cathode of the inherent diode 24 is connected to the positive pole of the first voltage source 12 and the anode is connected to the negative pole of the second voltage source 14. A control terminal (gate terminal) of the switch stage 20 is connected to a control unit 28.

Figure 2:
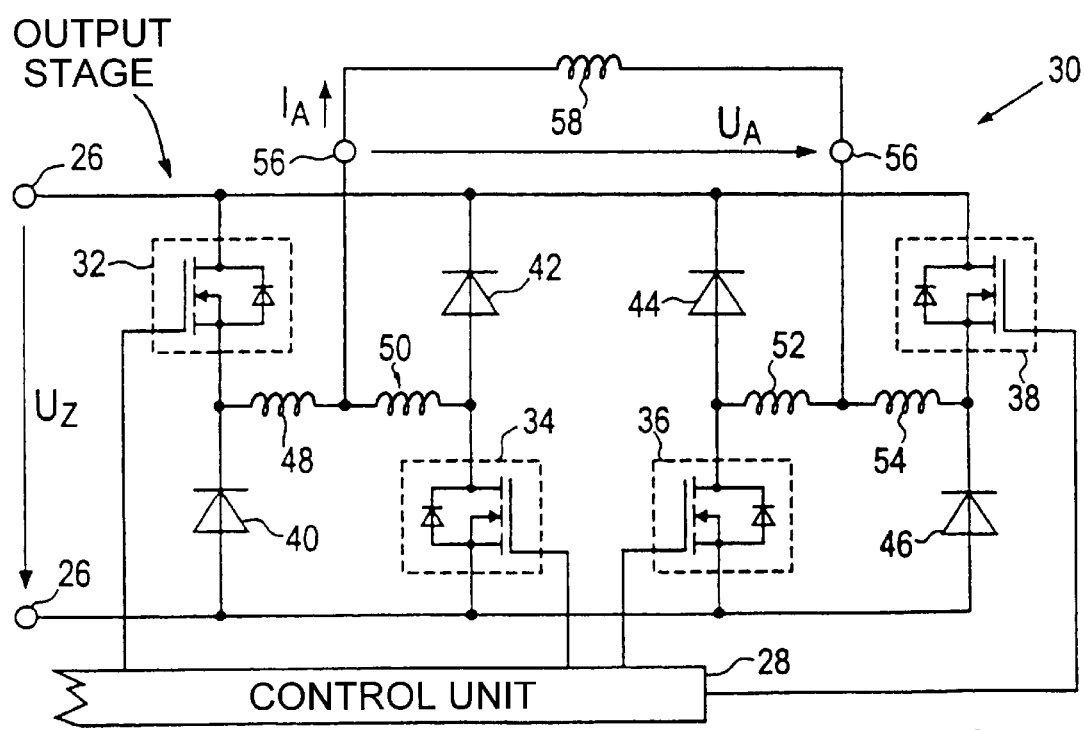
FIG. 2 is a block circuit diagram of a known output stage which can be used in the inventive power amplifier.

FIG. 2 shows a known output stage 30 that is connected to the supply assembly 20 via the intermediate circuit terminals 26. The output stage 30 is fashioned on the basis of bridge circuitry with four bridge arms. The bridge arms respectively contain a switch element 32–38 and diodes 40–46, with each switch element 32–38 connected in series with the respective diode 40–46 in the same bridge arm. The switch elements 32–38 are MOSFET transistors that each contain an inherent diode. The four bridge arms are arranged in parallel and are connected to the intermediate circuit voltage $U_z$. The switch elements 32–38 are driven by the control unit 28, that includes a current regulator and pulse-width modulator.

Respective inductors 48–54 are connected to the junctions of the series-connected switch elements 32–38 and diodes 40–46. The inductors 48–54 are arranged in two pairs, with the inductors in each pair connected in series. The junction between each inductor pair is connected to one of the output terminals 56. A predominantly inductive load 58, a gradient coil here, is connected to the two output terminals 56. An output voltage $U_A$ of the output stage 30 is across the load 58, and an output current $I_A$ flows through the load 58. The functioning of the output stage 30 and its structure are disclosed in greater detail in German OS 40 07 566 (corresponding to U.S. Pat. No. 5,113,145), the latter of which is incorporated herein by reference.

All components of the gradient amplifier are wired by low-inductance circuit boards with planar conductor structures in order to avoid parasitic voltage spikes, as described in German OS 40 07 566 and U.S. Pat. No. 5,113,145.

During operation of the gradient amplifier shown in FIG. 1 and FIG. 2, the control unit 28 drives the switch stage 20 of the supply assembly 10 and the switch elements 32–38 of the output stage 30. When the switch stage 20 (either the MOSFET transistor 22 or the inherent diode 24) is conducting, the voltage sources 12 and 14 are connected in series. When, by contrast, the switch stage 20 is open (non-conducting), then the voltage sources 12 and 14 deliver the intermediate circuit voltage $U_z$ in parallel circuitry.

The control unit 28 determines the required output voltage $U_A$ as well as the operating condition (normal or feedback mode) of the power amplifier and switches the MOSFET transistor 22 into a conductive state when either the output voltage $U_A$ exceeds a predetermined threshold or a feedback mode occurs. Further, the control unit 28 drives the switch elements 32–38 of the output stage 30 in order to generate the output current $I_A$ corresponding exactly to a reference current value by pulse-width modulation.

Figure 3:
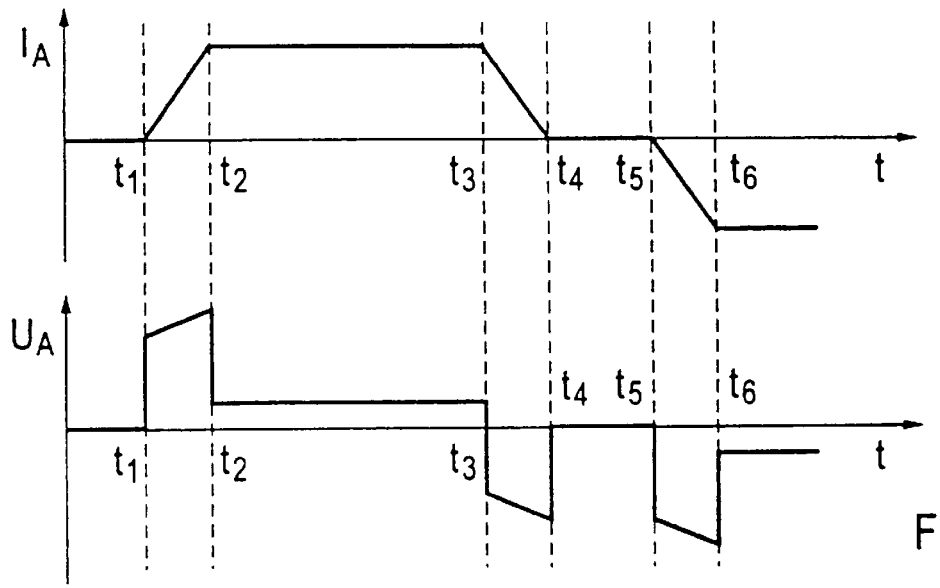
FIG. 3 illustrates a current curve and voltage curve in the inventive power amplifier.

Exemplary curves of the output current $I_A$ and of the output voltage $U_A$ are shown in FIG. 3. In a time span $t_1-t_2$ that, for example, can amount to 1 ms, the output current $I_A$ in FIG. 3 rises from zero to a maximum value, for example +300 A. The output current remains constant in the time span $t_2-t_3$ and then drops back to zero in the time span $t_3-t_4$. Further, a negative output current $I_A$ flows through the load 58 in the time span $t_5-t_6$, assuming a maximum value of, for example, –300 A at time $t_6$.

An output voltage $U_A$ according to the relationship $$U_A = L \cdot di/dt + I_A \cdot R$$

is required in order to produce the output current $I_A$ in the load 58, whereby L indicates the inductance of the inductive load 58, R the ohmic resistance thereof and di/dt the current rise rate (steepness). Given the example shown in FIG. 3, a high output voltage $U_A$ in terms of magnitude is required during the steep current ramps in the time spans $t_1-t_2$, $t_3-t_4$ and $t_5-t_6$, whereas only a relatively slight output voltage $U_A$ for compensating the ohmic losses in the load 58 is required for holding the maximum value in the time span $t_2-t_3$.

The high current rise rate in the time span $t_1-t_2$ that requires a high output voltage $U_A$ exceeds the threshold prescribed in the control unit 28, so that the MOSFET transistor 22 is placed in its conducting state, and the voltage sources 12 and 14 are thus connected in series. The voltage $U_1+U_2$ (or $2 \cdot U_1$ because $U_1$ is equal to $U_2$) is now across the terminals 26 as the intermediate circuit voltage $U_z$. The output voltage $U_A$ can be regulated up to the full intermediate circuit voltage $U_z$.

If, deviating from FIG. 3, only a gradual rise of the output voltage $U_A$ is required, the control unit 28 likewise doubles the intermediate circuit voltage $U_z$ as soon as the threshold is exceeded. The voltage discontinuity of the intermediate circuit voltage $U_z$ is immediately compensated by a corresponding drive of the switch elements 32–38 of the output stage 30 (reducing the active pulse widths), so that a linear regulation, without any discontinuities of the output voltage $U_A$ and of the output current $I_A$ is assured.

When the current rise rate falls below the threshold in terms of magnitude, or when (in the time span $t_2-t_3$ in FIG. 3) the current reaches the pulse maximum, then the control unit 28 places the MOSFET transistor 22 in a blocking state. Via the diodes 16 and 18 acting as decoupling diodes, the voltage sources 12 and 14 are thus switched into the parallel mode. The intermediate circuit voltage drops to $U_z = U_1 = U_2$, resulting in significantly lower switching losses at the switch elements of the output stage 30, and the power required for the compensation of the ohmic losses in the load 58 is uniformly distributed between the voltage sources 12 and 14.

The inductive load 58 is rapidly demagnetized (negative current ramp di/dt) in the time span $t_3-t_4$. The magnetic energy (½·L·I$_A^2$) stored in the load 58 is thereby fed back into the voltage sources 12 and 14. A high intermediate circuit voltage U$_Z$ is again required for rapidly dismantling the output current I$_A$ in this feedback mode. Even without the intervention of the control unit 28, the voltage sources 12 and 14 are connected in series here because the diodes 16 and 18 are blocking in the feedback path and the inherent diode 24 of the switch means 20 is conductive. Regardless of the amplitude of the intermediate circuit voltage U$_Z$, a continuous current regulation by pulse-width modulation of the output stage 30 also ensues.

In order to insure a uniform division of the returned magnetic energy between the voltage sources 12 and 14 during the feedback mode, the sources must exhibit identical impedances. This, for example, can be assured if the voltage sources 12 and 14 respectively contain internal buffer capacitors of the same size.

A negative output current I$_A$ is built up in the load 58 beginning at the point in time t$_5$. Since the polarity of the output current I$_A$ is defined in a known way by the drive of the switch bridge in the output stage 30 (and the intermediate circuit voltage U$_Z$ always exhibits a constant polarity), the switch unit 20 is driven here in the same way that was set forth above for a positive output current I$_A$.

As presented above, the inherent diode 24 is in a conducting stage in the feedback mode, so that an additional drive of the MOSFET transistor 22 is actually not required. If, however, a direct change from one direction of the output current I$_A$ to the other direction is to ensue, the MOSFET transistor 22 must be switched to the conducting state no later than the zero-axis crossing. If cut-in took place exactly at the zero-axis crossing, however, this would be time-critical and could lead to undesired noise pulses. The control unit 28 therefore always places the MOSFET transistor 22 into a conductive state when a voltage in the conducting direction is across the inherent diode 24. This avoids the problem just described and is possible without further difficulty since the drain-source channel of the MOSFET transistor 22 is conductive in both directions.

Figure 4:
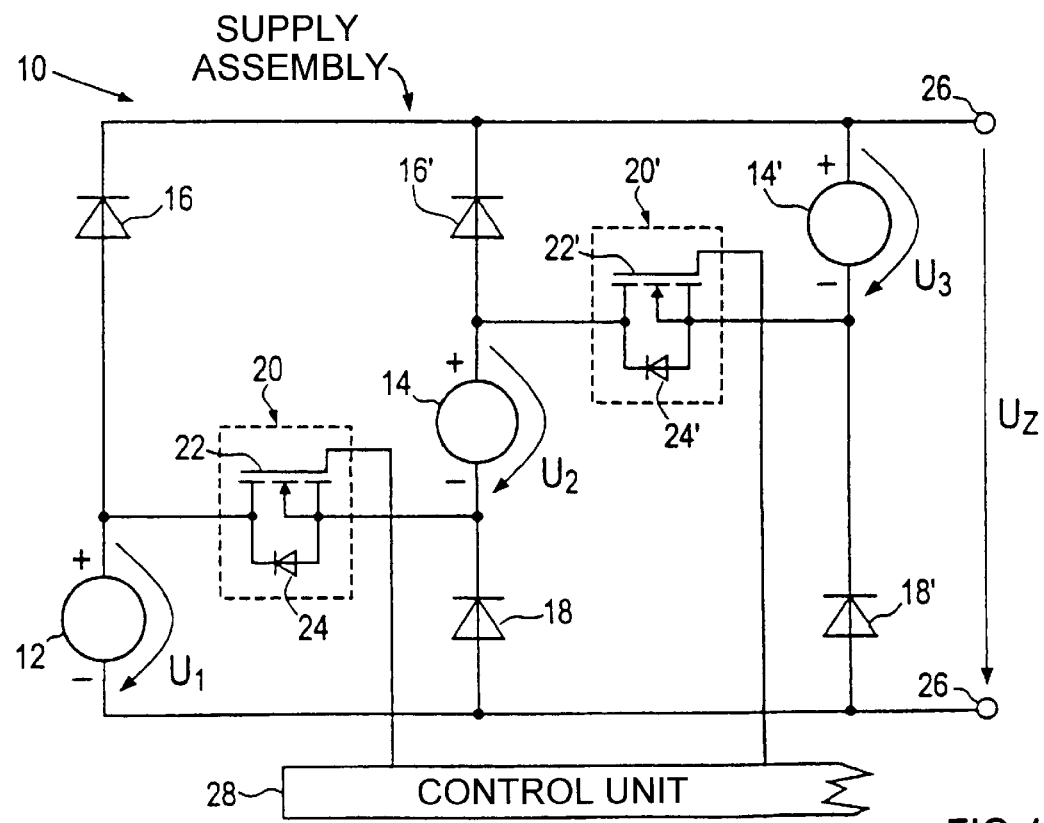
FIG. 4 IS a block circuit diagram of a modified embodiment of the supply assembly of FIG. 1.

An alternative embodiment of the supply assembly 10 shown in FIG. 4 is expanded by a third branch compared to that shown in FIG. 1. This third branch includes a third voltage source 14' for offering a third supply voltage U$_3$, with U$_1$=U$_2$=U$_3$. The third voltage source 14' is connected to the intermediate circuit terminals 26 via a further diode 18'. An additional diode 16' is connected as a decoupling diode between the positive pole of the second voltage source 14 and the corresponding intermediate circuit terminal 26.

Like the switch stage 20, a further switch stage 20' is composed of a MOSFET transistor 22' with an inherent diode 24' and is connected between the second and the third branches of the supply assembly 10, to the positive pole of the second voltage source 14 and to the negative pole of the third voltage source 14'. A control input of the switch stage 20' is connected to the control means 28.

During operation of a gradient amplifier that contains the supply assembly 10 of FIG. 4 and the output stage 30 of FIG. 2, the two switch stages 20 and 20' in the exemplary embodiment described here are always driven in common. When the switch stages 20 and 20' are conducting, then the voltage sources 12, 14 and 14' are connected in series. The intermediate circuit voltage U$_Z$ thus amounts to U$_1$+U$_2$+U$_3$ or, since the voltages U$_1$ through U$_3$ are the same, three times the value of any of these voltages. When the switch stages 20 and 20' are open (non-conducting), then the voltage sources 12, 14 and 14' act in parallel and U$_Z$=U$_1$=U$_2$=U$_3$ applies. A variation of the intermediate circuit voltage by a factor of 3 is thus possible overall given the circuit of FIG. 4.

In the alternative embodiments of the supply assemblies shown in FIG. 1 and FIG. 4, the switch stages 20 and 20' can be formed by other suitable switch elements, for example IGBTs (insulated gate bipolar transistors). Separate unbiased diodes, which are already inherently present in MOS field effect transistors, may possibly then be connected with opposite polarity for the feedback. Further, more than three voltage sources can be provided or the voltage sources can exhibit different voltages. Switching to produce combinations of series and parallel circuitry, rather than only series or only parallel, are also possible.

Although modifications and changes may be suggested by those skilled in the art, it is the intention of the inventor to embody within the patent warranted hereon all changes and modifications as reasonably and properly come within the scope of his contribution to the art.

I claim as my invention:

1. A power amplifier comprising:

a supply assembly which produces an intermediate circuit voltage at a supply assembly output;

an output stage, comprising a plurality of driveable switch elements, connected to said supply assembly output for generating an output voltage at an output stage output from said intermediate circuit voltage;

said supply assembly comprising at least two voltage sources and at least one switch stage, and means for optionally connecting said at least two voltage sources in parallel or in series via said at least one switched stage; and control means for driving said switch elements of said output stage and for operating said at least one switch stage for connecting said at least two voltage sources in series when a desired output voltage exceeds a predetermined threshold.

2. A power amplifier as claimed in claim 1 wherein said supply assembly comprises a plurality of branches connected in parallel, each of said branches containing one of said voltage sources and at least one diode connected in series with the voltage source in the branch.

3. A power amplifier as claimed in claim 1 wherein each of said two voltage sources has two poles of opposite polarity, and wherein said switch stage is connected between said at least two voltage sources to respective poles of the voltage sources of opposite polarity.

4. A power amplifier as claimed in claim 1 wherein said at least one switch stage comprises at least one diode for switching said at least two voltage sources in series in a feedback mode.

5. A power amplifier as claimed in claim 1 wherein said control means comprises means for connecting said voltage sources in series in a feedback mode.

6. A power amplifier as claimed in claim 1 wherein said output stage contains a switch bridge, and wherein said output stage comprises means for generating said output voltage from said intermediate circuit voltage using said switch bridge by pulse-width modulation.

* * * * *